(12) United States Patent
Yamada et al.

(10) Patent No.: US 12,334,707 B2
(45) Date of Patent: Jun. 17, 2025

(54) SEMICONDUCTOR LASER LIGHT SOURCE MODULE, SEMICONDUCTOR LASER APPARATUS

(71) Applicant: DENSO CORPORATION, Kariya (JP)

(72) Inventors: Hitoshi Yamada, Kariya (JP); Yoshiaki Hoashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 726 days.

(21) Appl. No.: 17/644,707

(22) Filed: Dec. 16, 2021

(65) Prior Publication Data

US 2022/0109285 A1 Apr. 7, 2022

Related U.S. Application Data

(63) Continuation of application No. PCT/JP2020/021561, filed on Jun. 1, 2020.

(30) Foreign Application Priority Data

Jun. 19, 2019 (JP) .................................. 2019-113465
May 19, 2020 (JP) .................................. 2020-087166

(51) Int. Cl.
*H01S 5/042* (2006.01)
*H01S 5/02315* (2021.01)
*H01S 5/40* (2006.01)

(52) U.S. Cl.
CPC ...... *H01S 5/04256* (2019.08); *H01S 5/02315* (2021.01); *H01S 5/4031* (2013.01)

(58) Field of Classification Search
CPC ............. H01S 5/04256; H01S 5/02315; H01S 5/4031; H01S 5/02345; H01S 5/0239
See application file for complete search history.

(56) References Cited

U.S. PATENT DOCUMENTS

2002/0167979 A1* 11/2002 Kato ........................ H01S 5/042
372/38.02
2005/0078720 A1* 4/2005 Walker ................ H01S 5/02253
372/36
2006/0262820 A1* 11/2006 Itoh ........................ G11B 7/1353
(Continued)

FOREIGN PATENT DOCUMENTS

JP 2017-98335 A 6/2017
JP 2017-103271 A 6/2017

*Primary Examiner* — Xinning(Tom) Niu
(74) *Attorney, Agent, or Firm* — Maschoff Brennan (57) ABSTRACT

A semiconductor laser light source module includes an emission unit provided with an upper electrode and a lower electrode, emitting a laser light in one direction; a laser diode having a plurality of emission units arranged in a state where emission directions of the laser light are aligned; a plurality of package side electrodes that supply current to respective emission units; and a plurality of first wires that electrically connect respective upper electrodes of the plurality of emission units with the package side electrodes corresponding to the upper electrodes individually. One first wire that connects one emission unit in the arranged emission units with one of package side electrodes corresponding to the one emission unit, and the other first wire that connects the other emission unit adjacent to the one emission unit with one of package side electrodes corresponding to the other emission unit are non-parallel in plan view.

8 Claims, 6 Drawing Sheets

(56) References Cited

U.S. PATENT DOCUMENTS

2010/0172609 A1\* 7/2010 Rolston ............... H01S 5/02345
 385/14
2018/0088293 A1  3/2018 Toyonaka et al.
2020/0136347 A1\* 4/2020 Charlebois .......... H01S 5/02234

\* cited by examiner

SEMICONDUCTOR LASER LIGHT SOURCE MODULE, SEMICONDUCTOR LASER APPARATUS

CROSS-REFERENCE TO RELATED APPLICATIONS

This application is the U.S. bypass application of International Application No. PCT/JP2020/21561 filed on Jun. 1, 2020, which designated the U.S. and claims priority to Japanese Application Nos. 2019-113465 and 2020-87166 filed on Jun. 19, 2019 and May 19, 2020 respectively, and the contents of these are incorporated herein by reference.

BACKGROUND

Technical Field

The present disclosure relates to a semiconductor laser light source module and a semiconductor laser module.

Description of the Related Art

As a conventional art, a semiconductor laser light source module is known. The semiconductor laser light source module is provided with a plurality of laser diodes arranged therein in which respective laser diodes are connected to a plurality of electrodes on the circuit board by the bonding wires. However, according to the conventional technique, in the case where an emission signal is outputted to a single laser diode among the plurality of laser diodes, a problem arises in which an adjacently positioned laser diode emits unnecessary laser light.

In the light of the above-mentioned circumstances, the present disclosure can be embodied with the following embodiments or application examples.

SUMMARY

As one aspect of the present disclosure, a semiconductor laser light source module is provided. The semiconductor laser light source module includes an emission unit provided with an upper electrode and a lower electrode, emitting a laser light in one direction; a laser diode having a plurality of emission units arranged in a state where emission directions of the laser light are aligned; a plurality of package side electrodes that supply current to respective emission units; and a plurality of first wires that electrically and individually connect respective upper electrodes of the plurality of emission units with the package side electrodes corresponding to the upper electrodes. One first wire that connects one emission unit in the arranged emission units with one of the package side electrodes corresponding to the one emission unit, and the other first wire that connects the other emission unit adjacent to the one emission unit with one of package side electrodes corresponding to the other emission unit are non-parallel in plan view.

BRIEF DESCRIPTION OF THE DRAWINGS

The above-described object and other object, features and advantages of the present disclosure will be more clarified with the following detailed description with reference to the attached drawings. The drawings are.

DETAILED DESCRIPTION OF THE PREFERRED EMBODIMENTS

As conventional art, a semiconductor laser light source module is known. For example, Japanese Patent Application Laid-Open Publication Number 2017-103271 discloses a semiconductor laser light source module provided with a plurality of laser diodes arranged therein in which respective laser diodes are connected to a plurality of electrodes on the circuit board by bonding wires.

However, according to the conventional technique, in the case where an emission signal is outputted to a single laser diode among the plurality of laser diodes, a problem arises in which an adjacently positioned laser diode emits unnecessary laser light.

A. First Embodiment

Figure 1:
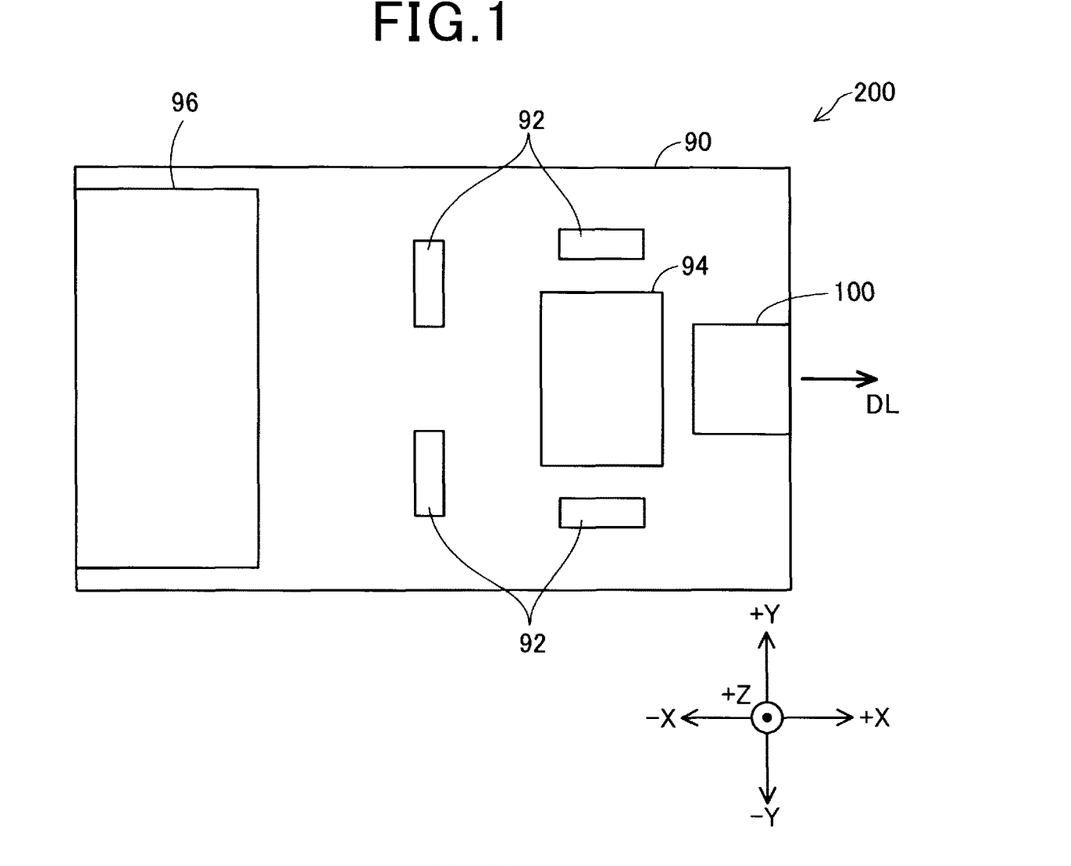
FIG. 1 is an explanatory diagram showing an overall configuration of a semiconductor laser apparatus.

As shown in FIG. 1, a semiconductor laser apparatus 200 according to the present embodiment is provided with a connector 96, a capacitor 92, an LD driver 94 and a semiconductor laser light source module 100 disposed on a circuit substrate 90 as a rigid type printed wiring board. The semiconductor laser light source module 100 is hereinafter referred to simply as a module 100. In FIG. 1, illustration of conductor wiring on the circuit substrate is omitted.

The semiconductor laser apparatus 200 is mounted on an optical ranging apparatus using light detection and ranging (i.e. LIDAR) technique, and is used for a laser light source of an optical ranging apparatus. The semiconductor laser apparatus 200 may be used for an optical ranging apparatus other than LIDAR, and for a laser light source for various usages such as recording on or reading a disc, a laser printer, a lighting apparatus, a laser microscope and a laser marker.

The module 100 is provided with a laser diode 40 thereinside which will be described later and is configured to emit laser light from the laser diode 40 in one direction. The module 100 is disposed at a position in the +X direction side with respect to the position where the LD driver 94 is positioned, and at an end portion of the circuit substrate 90. In order to easily realize the technique, XYZ directions and the emission direction DL of the laser light are schematically shown in FIG. 1. The emission direction DL equals to the +X direction. The XYZ directions are commonly indicated through the respective figures including FIG. 1, the indication of the directions utilizes positive and negative signs for determining directions in which positive direction is indicated by +, and the negative direction is indicated by −.

The connector 96 is a connection terminal for connecting with a control unit of the optical ranging apparatus. The emission signal outputted from the control unit is transmitted to an LD driver 94 via the connector 96. The emission signal is an electrical signal that indicates an emission timing of a laser diode 40 provided in the module 100. The LD driver 94 is electrically connected to the module 100 and switches the laser light output ON/OFF by driving the module 100. The capacitor 92 supplies the module 100 with charges stored during the switching of the LD driver 94 as short-pules current.

Figure 2:
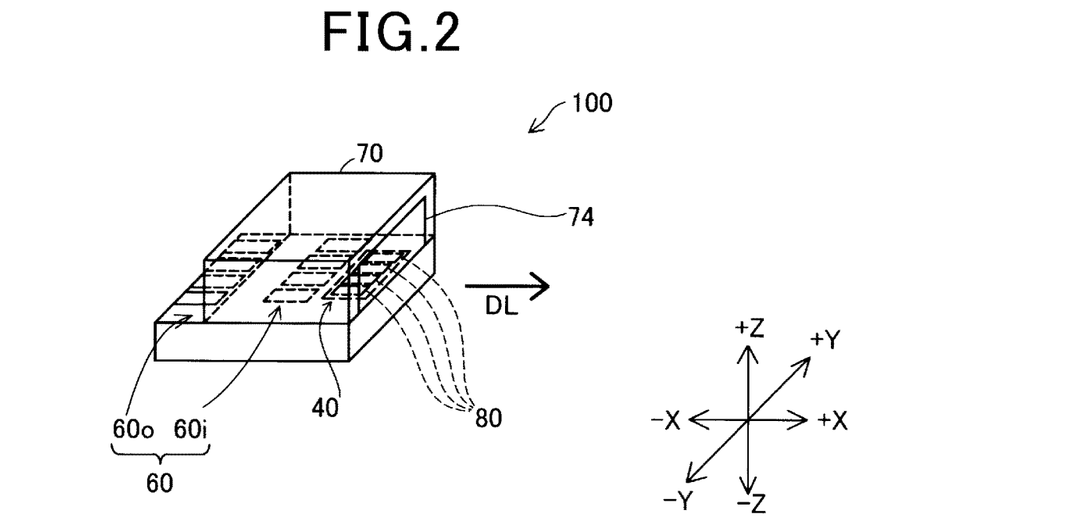
FIG. 2 is an explanatory diagram showing a configuration of a semiconductor laser light source module.

As shown in FIG. 2, the semiconductor laser light source module 100 according to the present embodiment is provided with a single laser diode 40 on a base plate made of ceramic disposed inside the inner space of a housing 70. The laser diode 40 includes a plurality of emission units 80. A sub-mount may be provided between the laser diode 40 and the base plate for suppressing stress caused by differences in coefficient of thermal expansion. According to the present embodiment, four emission units 80 are provided for a single laser diode 40 and arranged in the Y direction such that emission directions DL of the laser light to be emitted from respective emission units 80 are aligned to be mutually the same. The semiconductor laser light source module 100 may be configured to have four laser diodes and corresponding four emission units 80. The number of emission units 80 is not limited to four but may be any number of two or more. The emission units 80 are arranged straight along the Y direction but may be arranged having an alternating positional relationship such as zigzag shape. The housing 70 is provided with a transparent unit 74 that allows the laser light to pass through.

The emission units 80 emit laser light for ranging in the emission direction DL. The pulse width of the laser light emitted from the emission units 80 is, for example, approximately 5 ns so as to make the resolution of the ranging higher by using the short-pulse of 5 ns. The laser diode 40 is controlled by the LD driver 40 to cause each emission unit 80 to emit laser light individually. For the respective emission units 80, power and signals are supplied by the LD driver 94 via the package side positive electrode 80. The package positive electrode 60 will be detailed later.

Figure 3:
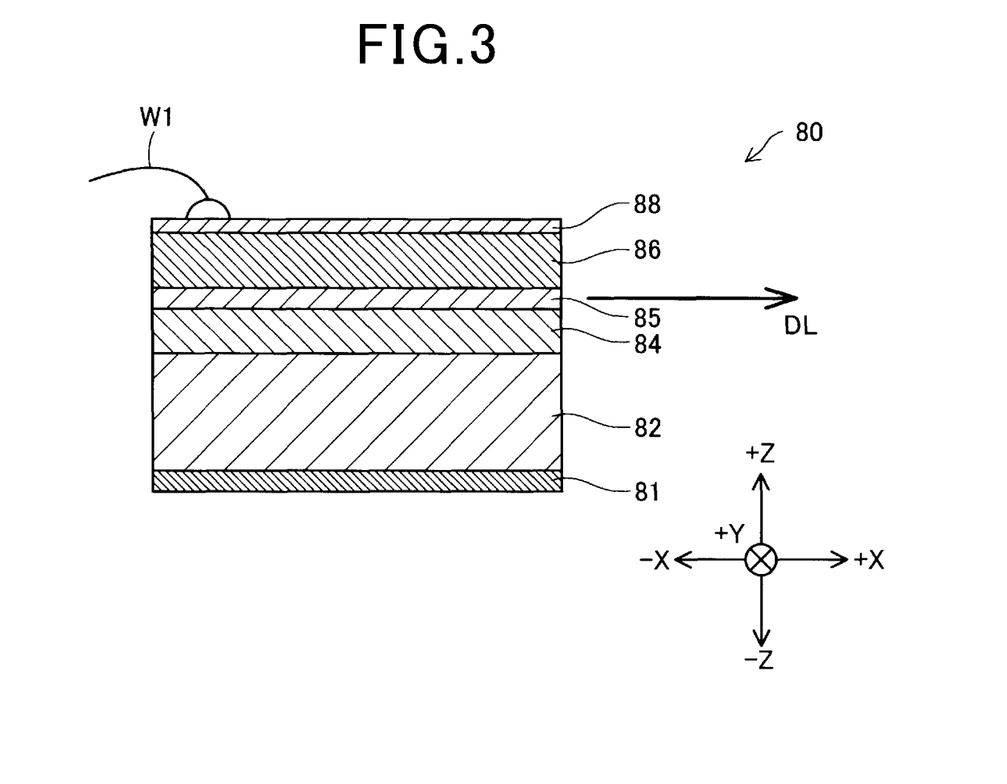
FIG. 3 is a cross-sectional view showing a structure of an emission unit of a laser diode.

With reference to FIG. 3, a structure of each emission unit 80 will be described. The emission unit 80 has a semiconductor layer having an emission layer configured of a pn-junction thereinside, the emission layer emitting laser light. As shown in FIG. 3, the semiconductor layer is provided with a double hetero-junction structured layer, where an active layer 85 is sandwiched by a n-type clad layer 84 and a p-type clad layer 86, disposed on a n-type substrate 82. Both end faces of the emission unit 80 in the X direction are formed as a cleavage plane, and serve as a laser emission side end face configuring an oscillator thereinside and a reflection side end face. The emission unit 80 may include a low-reflection rate coating film on the laser emission side end face and high-reflection rate coating film on the laser reflection side end face. The current is caused to flow from an upper electrode 88 as a positive electrode to a lower electrode 81 as a negative electrode, that is, the forward direction of the pn-junction, whereby electrons of n-type clad layer 84 and holes of p-type clad layer flow into the active layer to be coupled with each other, thus emitting the laser light. The light in the active layer 85 is emitted as laser light towards the emission direction DL by the induced emission.

Figure 4:
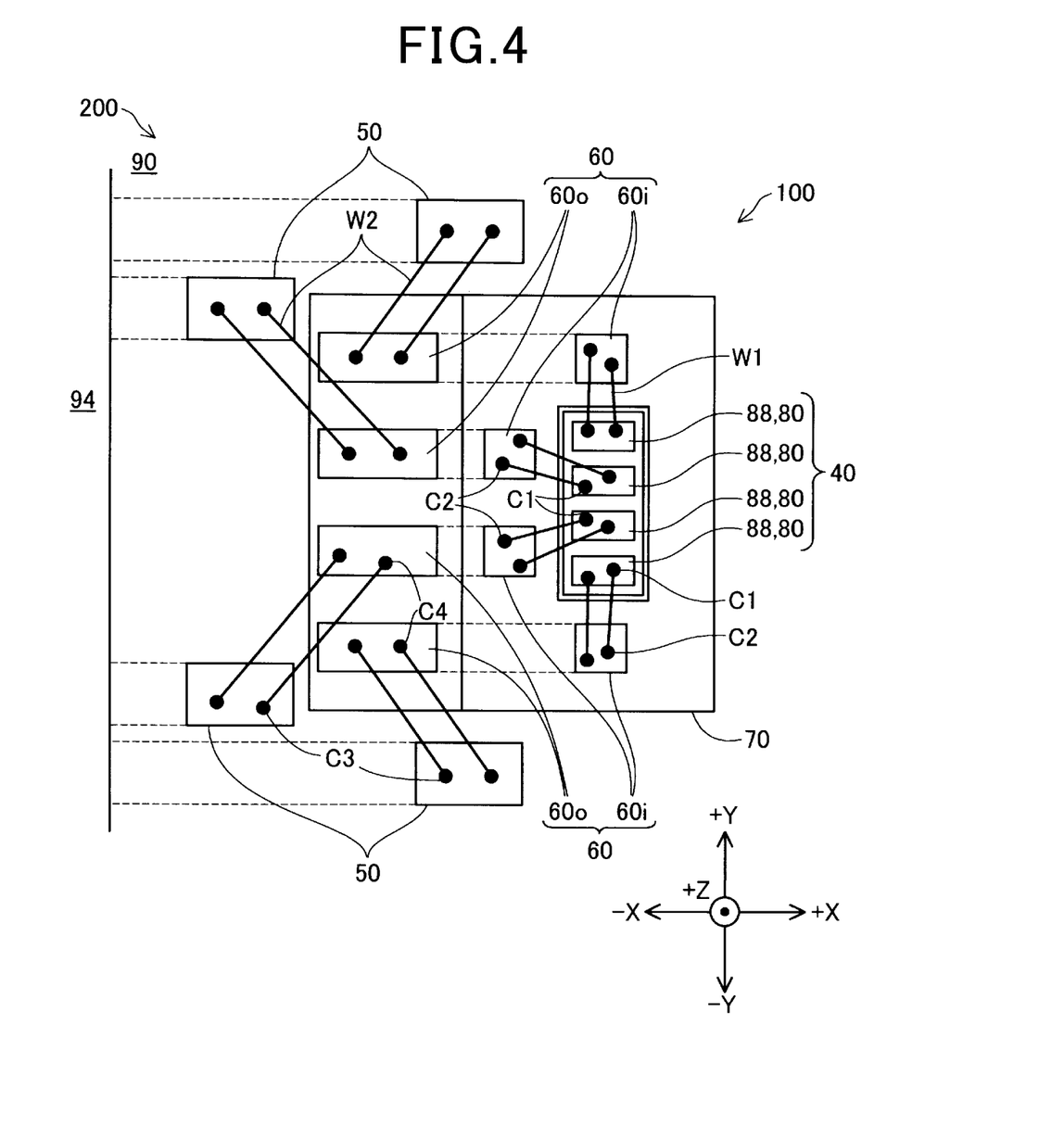
FIG. 4 is a plan view showing the semiconductor laser light source module and portion in the vicinity thereof.

With reference to FIG. 4, a configuration of the semiconductor laser apparatus 200 and a wiring configuration of the module 100 will be described. FIG. 4 schematically shows a region in the vicinity of the module 100 on the circuit substrate 90 of the semiconductor laser apparatus 200. Each emission unit 80 of the module 100 is electrically connected to the LD driver 94 via package side electrodes including a package side positive electrode 60 and a package side negative electrode which is not shown, substrate side electrodes including a substrate side positive electrode 50 and a substrate side negative electrode which is not shown. More specifically, the upper electrode 88 of each emission unit 80 is electrically connected to the package side positive electrode 60 as a positive electrode (anode) and the substrate side positive electrode 50. The lower electrode 81 of each emission unit 70 is electrically connected to the package side negative electrode as a negative electrode (cathode) and the substrate side negative electrode. The package side negative electrode is an electrode wiring which is common for respective emission units 80, and connected to each lower electrode 81 of the emission units 80. The package side negative electrode is electrically connected to the substrate side negative electrode as a conductor wiring of the negative electrode side of the LD driver 94.

The substrate side positive electrode 50 is one end of the positive electrode side conductor wiring led out from the LD driver 94 of the circuit substrate 90, and serves as an electrode pad exposed in the circuit substrate 90. The substrate side positive electrode 50 supplies power and signals to the module 100 from the LD driver 94. The package side electrode 60 is a conductor wiring that connects between outside and inside the housing 70. The package side positive electrode 60 is configured corresponding to the respective plurality of emission units 80, having the same number of electrodes as the number of emission units 80 (four in number according to the present embodiment). One end side of the package side positive electrode 60 is an electrode pad 60o exposed outside the housing 70, and the other end side thereof is an electrode pad 60i exposed in the internal space of the housing 70.

The electrode pad 60i is electrically connected to the upper electrode 88 of the emission unit 70 via a first wire W1. The first wire W1 is configured of a conductor such as Au for example. One end side of the first wire W1 is bonded to a connection point C1 on a surface of the upper electrode 88, and the other end side is bonded to a connection point C2 on a surface of the electrode pad 60i. Thus, the first wire W1 electrically connects the emission unit 80 with the package side positive electrode 60. According to the present embodiment, the first wire W1 is two in number for a pair of upper electrode 88 and the electrode pad 60i. However, the first wire W1 may be one in number for the pair of upper electrode 88 and the electrode pad 60i. According to the present embodiment, lengths of the respective first wires W1 are the same, but may not be the same.

The electrode pad 60o is electrically connected to the substrate side positive electrode 50 via a second wire W2. The second wire W2 is configured of a conductor such as Au for example. One end side of the second wire W2 is bonded to a connection point C3 on a surface of the substrate side positive electrode 50, and the other end side is bonded to a connection point C4 on a surface of the electrode pad 60o. Thus, the second wire W2 electrically connects the LD driver 94 with the package side positive electrode 60. According to the present embodiment, the second wire W2 is two in number for a pair of substrate side positive electrode 50 and the electrode pad 60o. However, the second wire W2 may be one in number or any number for the pair of substrate side positive electrode 50 and the electrode pad 60o. According to the present embodiment, lengths of the respective second wires W2 is the same, but may not be the same. According to the present embodiment, lengths of the first wire W1 and the second wire W2 are mutually different, the lengths of the first wire W1 and the second wire W2 may be the same.

Figure 5:
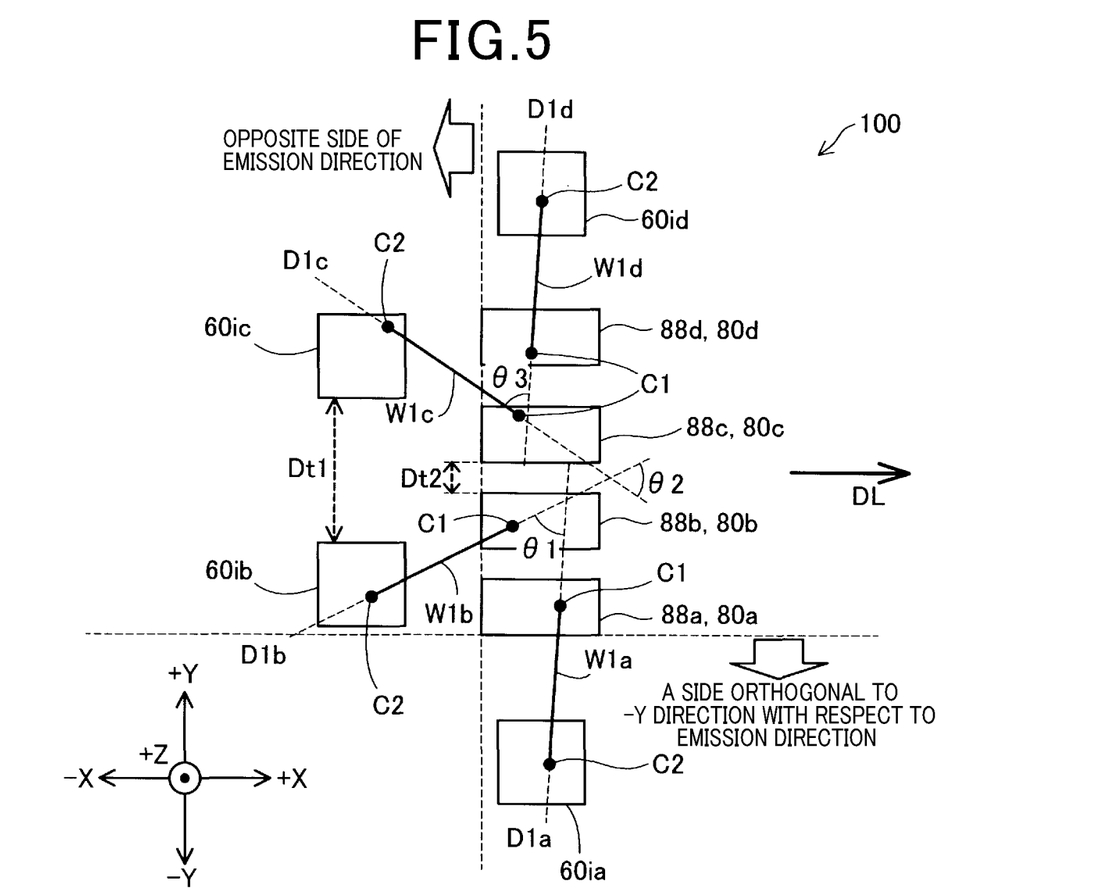
FIG. 5 is a plan view showing an arrangement of upper electrodes and package side positive electrodes.

With reference to FIG. 5, a positional relationship between the upper electrodes 88 of the respective emission units 80 of the module 100 and the electrode pad 60$i$ according to the present embodiment will be described. In FIG. 5, in order to easily realize the technique, the four emission units 80 are indicated as emission units 80$a$, 80$b$, 80$c$ and 80$d$ in this order along the Y axis, the upper electrodes 88 of the respective emission units 80$a$ to 80$d$ are indicated as upper electrode 88$a$, 88$b$, 88$c$ and 88$d$ respectively, and the electrode pads 60$i$ connected to corresponding upper electrodes 88$a$ to 88$d$ are indicated as the electrode pads 60$ia$, 60$ib$, 60$ic$ and 60$id$ respectively. For the first wire W1, in order to easily realize the technique, only one first wire W1 is shown for a combination of a pair of electrode 88 and the electrode pad 60$i$, for example. The first wires W1 connected to respective upper electrodes 88$a$ to 88$d$ are indicated as first wire W1a, W1b, W1c and W1d.

According to the module 100 of the present embodiment, the electrode pad 60$ia$ corresponding to the upper electrode 88$a$ is disposed in −Y direction side as a direction side orthogonal to the emission direction DL with respect to the upper electrode 88$a$. The electrode pad 601$ia$ is not disposed in an opposite side of the emission direction DL with respect to the upper electrode 88$a$, that is, −X direction side. On the other hand, the electrode pad 601$b$ corresponding to the upper electrode 88$b$ adjacent to the upper electrode 88$a$ is disposed in the opposite side (−X direction side) of the emission direction DL with respect to the upper electrode 88$b$. The electrode pad 60$ia$ is positioned in the +X direction side and the −Y direction side with respect to the electrode pad 60$ib$.

The respective electrode pads 60$ia$ and 60$ib$ and the respective upper electrodes 88$a$ and 88$b$ are thus arranged, whereby the first wire W1a and the first wire W1b are not parallel with each other (hereinafter also referred to as non-parallel) in plan view. This is because, in the case where the first wires W1 bonded to mutually adjacent respective emission units 80 approach closely each other in a parallel state, when one emission unit 80 is driven with high frequency, electromagnetic coupling is produced between the first wires W1, current flows through the other emission unit 80 causing undesired laser light emission.

A straight line D1a is defined as a straight line connecting between the connection point C1 between the first wire W1a and the upper electrode 88$a$, with the connection point C2 between the electrode pad 60$ia$ and the first wire W1a. A straight line D1b is defined as a straight line connecting between the connection point C1 between the first wire W1b and the upper electrode 88$b$, with the connection point C2 between the electrode pad 60$ib$ and the first wire W1b. The module 100 according to the present embodiment is configured such that the straight line D1a and the straight line D1b are non-parallel with each other in plan view. According to the present embodiment, when assuming the angle formed between the straight line D1a and the straight line D1b is an angle $\theta_1$, the angle $\theta_1$ is 60 degrees in plan view.

The module 100 according to the present embodiment is configured such that the positional relationship between the upper electrodes 88$c$ and 88$d$, and the electrode pads 60$ic$ and 60$id$, and the positional relationship between the above-described upper electrodes 88$a$ and 88$b$, and the electrode pads 60$i$ and 60$ib$ are substantially a line symmetry with respect to the X direction. More specifically, the electrode pad 60$id$ corresponding to the upper electrode 88$d$ is disposed in the +Y direction side as a direction side orthogonal to the emission direction DL with respect to the upper electrode 88$d$. The electrode pad 60$id$ is not disposed in an opposite side of the emission direction DL with respect to the upper electrode 88$d$, that is, −X direction side. On the other hand, the electrode pad 60$ic$ corresponding to the upper electrode 88$c$ adjacent to the upper electrode 88$d$ is disposed in the opposite side (−X direction side) of the emission direction DL with respect to the upper electrode 88$c$. The electrode pad 60$id$ is positioned in +X direction side and +Y direction side with respect to the electrode pad 60$ic$.

The respective electrode pads 60$ic$ and 60$id$, and respective upper electrodes 88$c$ and 88$d$ are arranged in this way, whereby the first wire W1c and the first wire W1d are configured to be not parallel with each other in plan view. More specifically, in the case where a straight line D1c is defined as a straight line connecting between the connection point C1 between the first wire W1c and the upper electrode 88$c$, with the connection point C2 between the electrode pad 60$ic$ and the first wire W1c, and a straight line D1d is defined as a straight line connecting between the connection point C1 between the first wire W1d and the upper electrode 88$d$, with the connection point C2 between the electrode pad 60$id$ and the first wire W1d, the angle $\theta_3$ formed between the straight line D1c and the straight line D1d is approximately 60 degrees in plan view.

According to the module 100 of the present embodiment, the distance Dt1 between the electrode pad 60$ib$ and the electrode 60$ic$ is larger than the distance Dt2 between the upper electrode 88$b$ and the upper electrode 88$c$ which are adjacently positioned with each other. These electrode pads and upper electrodes are thus arranged, the first wire W1b and the first wire W1c are configured to be not parallel with each other in plan view. When the angle formed between the straight line D1b and the straight line D1c is an angle $\theta_2$, the angle $\theta_2$ is approximately 60 degrees in plan view.

Figure 6:
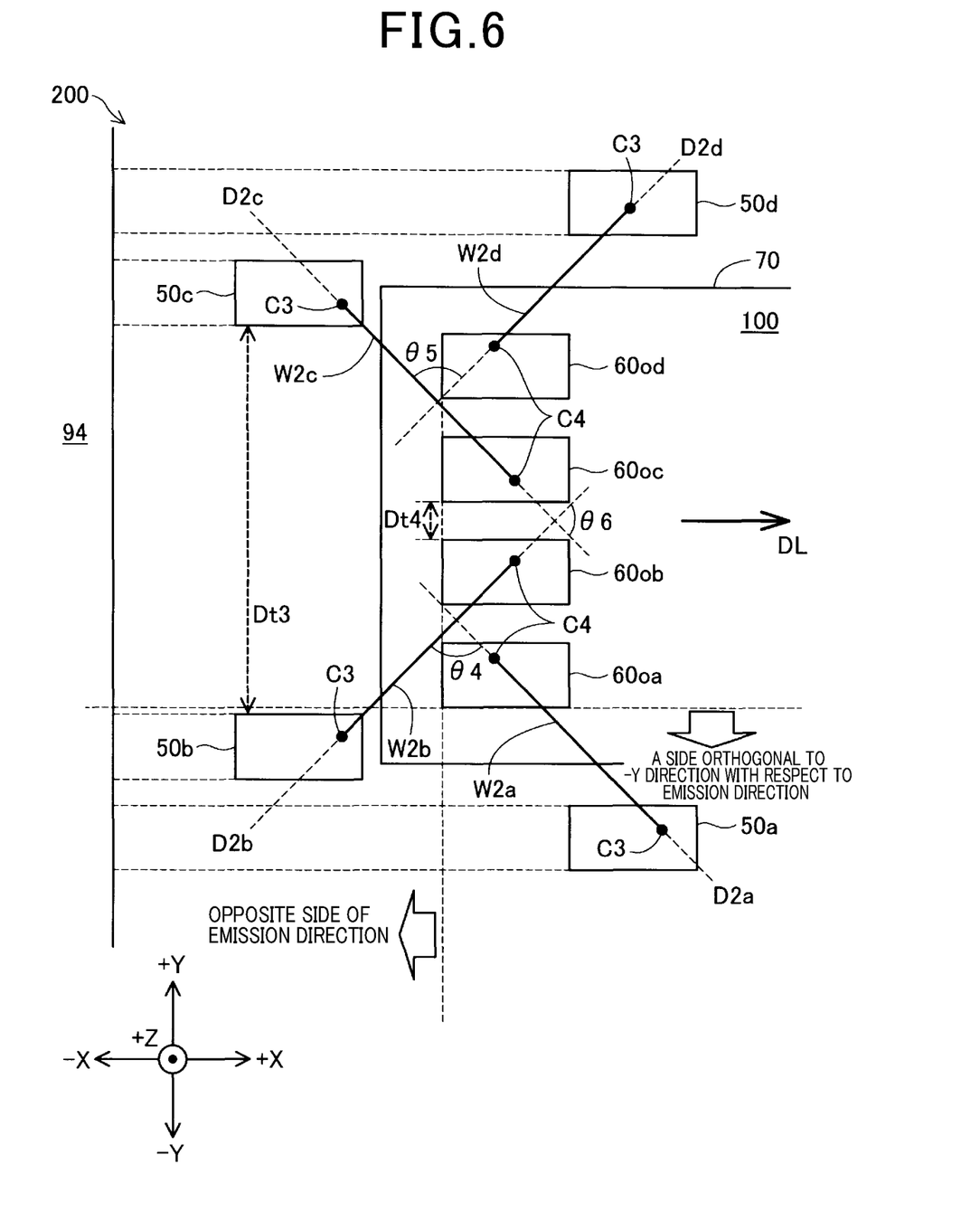
FIG. 6 is a plan view showing an arrangement of package side electrodes and substrate side electrodes.

With reference to FIG. 6, a positional relationship between the substrate side positive electrode 50 and the electrode pad 60$o$ will be described. In FIG. 6, in order to easily realize the technique, the four electrode pads 60$o$ are indicated as electrode pads 60$oa$, 60$ob$, 60$oc$ and 60$od$ in this order along the Y axis, and the substrate side positive electrodes 50 connected to respective electrode pads 60$oa$ to 60$od$ are shown as substrate side positive electrodes 50$a$, 50$b$, 50$c$ and 50$d$. In order to easily realize the technique, as an example, only one second wire W2 is shown for a combination of a pair of substrate side positive electrode 50 and the electrode pad 60$o$. The second wires W2 connected to the respective substrate side positive electrodes 50$a$ to 50$d$ are indicated as the second wire W2a, W2b, W2c and W2d respectively.

In the semiconductor laser apparatus 200, the substrate side positive electrode 50$a$ is disposed in a −Y direction side as a direction side orthogonal to the emission direction DL with respect to the electrode pad 60$a$ corresponding to the substrate side positive electrode 50$a$. The substrate side positive electrode 50$a$ is not disposed in an opposite side of the emission direction DL with respect to electrode pad 60$oa$, that is, −X direction. On the other hand, the substrate side positive electrode 50$b$ corresponding to the electrode pad 60$ob$ adjacent to the electrode pad 60$oa$ is disposed in the opposite side (−X direction side) of the emission direction DL with respect to the electrode pad 60$ob$. The substrate side positive electrode 50$a$ is positioned in +X direction side and −Y direction side with respect to the substrate side positive electrode 50$b$.

The respective electrode pads 60oa and 60ob, and the respective substrate side positive electrodes 50a and 50b are thus arranged, whereby the second wire W2a and the second wire W2b are configured to be non-parallel in plan view. More specifically, a straight line D2a is defined as a straight line that connects the connection point C3 between the second wire W2a and the substrate side positive electrode 50a, with the connection point C4 between the electrode pad 60oa and the second wire W2a. A straight line D2b is defined as a straight line that connects the connection point C3 between the second wire W2b and the substrate side positive electrode 50b, with the connection point C4 between the electrode pad 60ob and the second wire W2b. Then, the straight line D2a and the straight line D2b are non-parallel with each other in plan view. According to the present embodiment, when an angle formed between the straight line D2a and the straight line D2b is an angle θ4, it is configured that the angle θ4 is approximately 90 degrees.

The semiconductor laser apparatus 200 according to the present embodiment is configured such that the positional relationship between the substrate side positive electrodes 50c and 50d, and the electrode pads 60oc and 60od, and the positional relationship between the above-described substrate side positive electrodes 50a and 50b, and the electrode pads 60oa and 60ob are substantially a line symmetry with respect to the X direction. More specifically, the substrate side positive electrode 50d corresponding to the electrode pad 60od is disposed in the +Y direction side as a direction side orthogonal to the emission direction DL with respect to the electrode pad 60od. The substrate side positive electrode 50d is not disposed in an opposite side of the emission direction DL with respect to the electrode pad 60od, that is, −X direction side. On the other hand, the substrate side positive electrode 50c corresponding to the electrode pad 60oc adjacent to the electrode pad 60od is disposed in the opposite side (−X direction side) of the emission direction DL with respect to the electrode pad 60oc. The substrate side positive electrode 50d is positioned in +X direction side and +Y direction side with respect to the substrate side positive electrode 50c.

The respective electrode pads 60oc and 60od, and the respective substrate side positive electrodes 50c and 50d are thus arranged, whereby the second wire W2c and the second wire W2d are configured to be non-parallel in plan view. More specifically, in the case where a straight line D2c is defined as a straight line that connects the connection point C3 between the second wire W2c and the substrate side positive electrode 50c, with the connection point C4 between the electrode pad 60oc and the second wire W2c, and a straight line D2d is defined as a straight line that connects the connection point C3 between the second wire W2d and the substrate side positive electrode 50d, with the connection point C4 between the electrode pad 60od and the second wire W2d, an angle θ5 formed between the straight line D2c and the straight line D2d is 90 degrees in plan view.

Further, the distance Dt3 between the substrate side positive electrode 50b and the substrate side positive electrode 50c is larger than the distance Dt4 between the electrode pad 60ob and the electrode pad 60oc which are adjacently positioned with each other. These electrodes and pads are thus arranged, whereby the second wire W2b and the second wire W2c are configured to be non-parallel in plan view. When defining an angle formed between the straight line D2b and the straight line D2c to be an angle θ6, the angle θ6 is approximately 90 degrees in plan view.

As described above, according to the semiconductor laser light source module 100 of the present embodiment, one first wire W1 that connects one emission unit 80 in the plurality of emission units 80a to 80d arranged in one direction with the electrode pad 60i of the package side positive electrode 60 provided corresponding to the one emission unit 80, and the other first wire W1 corresponding to adjacent emission unit 80 are disposed to be non-parallel in plan view. According to the semiconductor laser light source module 100, since the first wires W1a to W1d are arranged to be non-parallel in plan view, electromagnetic coupling can be prevented from occurring between respective first wires W1 and undesired laser light emission can be suppressed. These effects become significant in the case where current having short pulse and high output flows into the emission unit 80 via the first wire W1.

According to the module 100 of the present embodiment, the electrode pad 60ia corresponding to the upper electrode 88a of the emission unit 80a is disposed in −Y direction side as a direction side orthogonal to the emission direction DL with respect to the upper electrode 88a, and the electrode pad 60ib corresponding to the upper electrode 88b of the emission unit 80b adjacent to the emission unit 80a is disposed in −X direction side as an opposite side of the emission direction DL with respect to the upper electrode 88b. Hence, the angle θ1 formed between the first wire W1a and the first wire W1b is set to be any inferior angle such that the first wire W1a and the first wire W1b are non-parallel, and one electrode pad 60ia and the other electrode pad 601ib can be effectively disposed in the vicinity of the emission units 80a and 80b. The same applies to the upper electrodes 88c and 88d, and the electrode pads 60ic and 60id.

According to the module 100 of the present embodiment, respective lengths of the first wires W1a to W1d are mutually the same. Thus, self-inductance between respective first wires W1a to W1d can be substantially the same and the transmission characteristics thereof can be substantially uniform.

According to the semiconductor laser apparatus 200 of the present embodiment, the second wire W2 that connects one electrode pad 60o in the plurality of electrode pads 60o and the substrate side positive electrode 50 corresponding to the one electrode pad 60o, and the other second wire W2 that connects other electrode pad 60o and the substrate side positive electrode 50 corresponding to the other electrode pad 60o are disposed to be non-parallel in plan view. Therefore, electromagnetic coupling can be prevented from occurring between respective second wires W2 and undesired laser light emission can be suppressed. These effects become significant in the case where current having short pulse and high output flows into the package side electrode 60 via the second wire W1.

According to the semiconductor laser module 200 of the present embodiment, the substrate side positive electrode 50a is disposed in −Y direction side as a direction side orthogonal to the emission direction DL with respect to the electrode pad 60oa corresponding to the substrate side positive electrode 50a, and the substrate side positive electrode 50b corresponding to the electrode pad 60ob is disposed in −X direction side as an opposite side of the emission direction DL with respect to the substrate side positive electrode 50b. Hence, the angle θ4 formed between the second wire W2a and the second wire W2b is set to be any inferior angle such that the second wire W2a and the second wire W2b are non-parallel, and the substrate side positive electrode 50a and the substrate side positive electrode 50b can be effectively disposed in the vicinity of the electrode pads 60oa and 60ob. The same applies to the substrate side positive electrode 50c and 50d, and the electrode pads 60oc and 60od.

According to the semiconductor laser apparatus 200 of the present embodiment, respective lengths of the second wires W2a to W2d are mutually the same. Thus, self-inductance between respective second wires W2a to W2d can be substantially the same and the transmission characteristics thereof can be substantially uniform.

B. Second Embodiment

Figure 7:
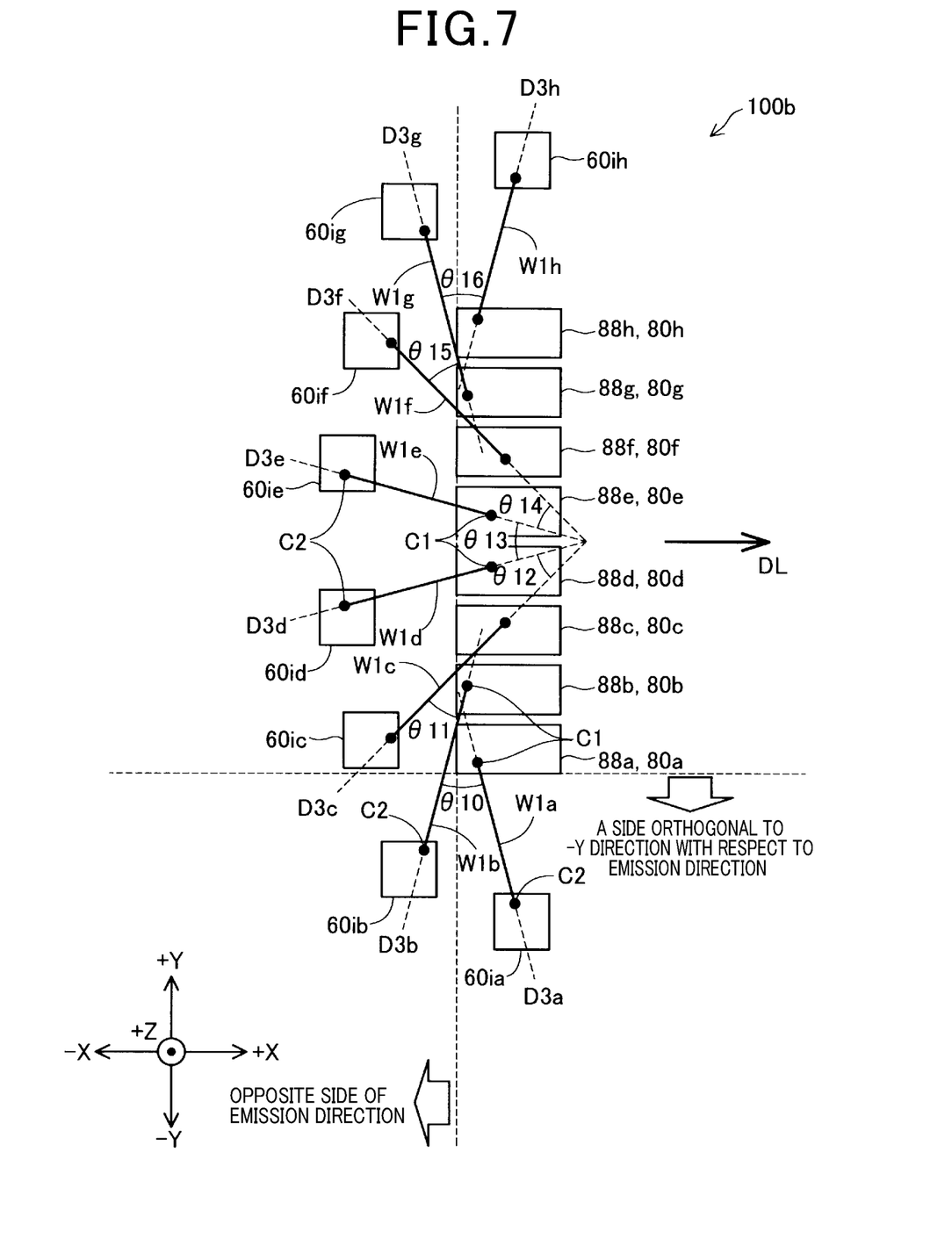
FIG. 7 is an explanatory diagram showing a configuration of a semiconductor laser light source module according to a second embodiment.

With reference to FIG. 7, a positional relationship between the upper electrodes 88 in the respective emission units 80 and the electrode pads 60i of the package side positive electrode 60 in the semiconductor light source module 100b according to the second embodiment will be described. As shown in FIG. 7, the semiconductor light source module 100b according to the present embodiment differs from the module 100 according to the first embodiment in that eight emission units 80 and eight electrode pads 60i are provided.

Similar to the first embodiment, the respective emission units 80 are arranged in a row along the Y direction in a state where the emission directions DL of the laser light are aligned. In FIG. 7, in order to easily realize the technique, eight emission units 80 are indicated as 80a to 80h in this order along the Y direction, the upper electrodes 88 of the respective emission units 80a to 80h are indicated as upper electrodes 88a to 88h respectively, and the electrode pads 60i connected to respective upper electrodes 88a to 88h are indicated as electrode pads 60ia to 60ih. The first wires W1 connected to the respective upper electrodes 88a to 88h are indicated as first wires W1a to W1h respectively, and straight lines that connect the connection point C1 with the connection point C2 of the respective first wires W1a to W1h are indicated as straight lines D3a to D3h respectively.

In the module 100b of the present embodiment, the electrode pad 60ia is disposed in the −Y direction side as a direction side orthogonal to the emission direction DL with respect to the upper electrode 88a, and the electrode pad 60ih is disposed in +Y direction as a direction side orthogonal to the emission direction DL with respect to the upper electrode 88h. The respective electrode pads 60ib to 60ig other than the electrode pads 60ia and 601h are disposed in −X direction side relative to the electrode pads 60ia and 60ih, and arranged surrounding a portion around the respective emission units 80a to 80h in a circular arc shape. These electrode pads are thus arranged, whereby the lengths of respective first wires W1a to W1h are mutually the same, and the angles θ10 to θ16 formed between respective straight lines D3a to D3h are each set to be approximately 30 degrees in plan view, and the respective wires W1a to W1h are mutually non-parallel in plan view.

In the module 100b of the present embodiment, the respective first wires W1a to W1h connected to eight emission units 80a to 80h are configured to be non-parallel. Even in the case where the number of emission units 80 is increased more than that of the module 100 in the first embodiment, occurrence of electromagnetic coupling can be suppressed between respective first wires W1, and undesired laser light emission can be suppressed. Note that the positional relationship between the upper electrodes 88 of the respective emission units 80 and the electrode pads 60i of the package side positive electrodes 60 in the above-described module 100b may be applied to the positional relationship between the electrode pads 60o and the substrate side positive electrodes 50 such that the respective second wires W2 are non-parallel in plan view.

C. Other Embodiments (C1) In the above-described respective embodiments, the angle θ1 to θ3 are set to be approximately 60 degrees, the angle θ4 to θ6 are set to be approximately 90 degrees, and the angle θ10 to θ16 are set to be approximately 30 degrees. However, it is not limited these angles, but any angle such as 10 degree, 45 degrees and 120 degrees may be set such that the first wires W1 are non-parallel with each other in plan view.

(C2) In the above-described respective embodiments, for example, like the straight line D1a and the straight line D1d, the first wires W1 connected to the emission unit 80a and the emission unit 80d which are not adjacent with each other may be parallel with each other in plan view. Also, the second wires W2, connected to electrode pads 60o which are not adjacent with each other, may be parallel with each other in plan view.

(C3) In the above-described respective embodiments, the electrode pad 60o is formed being exposed on a surface in +Z direction side outside the housing 70. However, the electrode pad 60o may be exposed on a back surface on the −Z direction side of the module 100. The electrode pad 60o is led outside the housing 70 in the back surface side from the electrode pad 60i in the housing 70 via a though hole vias and the like. According to the module 100 thus configured, the substrate side positive electrode 50 and the electrode pad 60o on the circuit substrate 90, and the substrate side negative electrode and the package side negative electrode on the circuit substrate 90 are electrically connected by a soldering or a die-bonding without using wires.

The present disclosure is not limited to the above-described embodiments and modification examples. However, the present disclosure but may be embodied with various configurations without departing from the spirits of the disclosure. For example, embodiments corresponding the technical features in the respective aspects described in the summary section and technical features described in the modification examples may be appropriately replaced or combined, in order to solve a part of or all of the above-described problems or to achieve a part of or all of the above-described effects. Further, in the case where the technical features are not described as necessary in the present disclosure, the technical features may be appropriately removed.

CONCLUSION

As one aspect of the present disclosure, a semiconductor laser light source module is provided. The semiconductor laser light source module includes an emission unit provided with an upper electrode and a lower electrode, emitting a laser light in one direction; a laser diode having a plurality of emission units arranged in a state where emission directions of the laser light are aligned; a plurality of package side electrodes that supply current to respective emission units; and a plurality of first wires that electrically and individually connect respective upper electrodes of the plurality of emission units with the package side electrodes corresponding to the upper electrodes. One first wire that connects one emission unit in the arranged emission units with one of package side electrodes corresponding to the one emission unit, and the other first wire that connects the other emission unit adjacent to the one emission unit with one of package side electrodes corresponding to the other emission unit are non-parallel in plan view.

The semiconductor laser light source module of the first aspect is configured such that the first wires connected to respective mutually adjacent laser diodes are non-parallel in plan view. Hence, electromagnetic coupling between respective first wires can be suppressed, and undesired laser light emission can be suppressed.

As another aspect of the present disclosure, a semiconductor laser apparatus is provided.

The semiconductor laser apparatus is provided with: a semiconductor laser light source module including an emission unit provided with an upper electrode and a lower electrode, emitting a laser light in one direction, a laser diode having a plurality of emission units arranged in a state where emission directions of the laser light are aligned, and a plurality of package side electrodes that supply current to respective emission units; a circuit substrate including a plurality of substrate side electrodes, supplying power and a signal to the semiconductor laser light source module; and a plurality of second wires that electrically and individually connect respective package side electrodes with respective substrate side electrodes.

One second wire that connects one package side electrode in the plurality of package side electrodes with the substrate side electrode corresponding to the one package side electrode, and the other second wire that connects the other package side electrode adjacent to the one package side electrode with the substrate side electrode corresponding to the other package side electrode, are non-parallel with each other in plan view.

The semiconductor laser apparatus of another aspect is configured such that the second wires connected to respective mutually adjacent package electrodes are non-parallel in plan view. Hence, electromagnetic coupling to between respective second wires can be suppressed, and undesired laser light emission can be suppressed.

What is claimed is:

1. A semiconductor laser light source module comprising:
   an emission unit provided with an upper electrode and a lower electrode, emitting a laser light in one direction;
   an end face emitting laser diode having a plurality of emission units arranged in a state where emission directions of the laser light are aligned;
   a plurality of package side electrodes that supply current to respective emission units; and
   a plurality of first wires that electrically and individually connect respective upper electrodes of the plurality of emission units with the package side electrodes corresponding to the upper electrodes,
   wherein
      one package side electrode corresponding to one emission unit in the arranged emission units is disposed in an opposite side of a portion where the laser light is emitted with respect to the one emission unit, one package side electrode corresponding to the other emission unit adjacent to the one emission unit is disposed in a direction side orthogonal to a direction along which the laser light is emitted with respect to the other emission unit,
      whereby one first wire that connects the one emission unit with the one package side electrode corresponding to the one emission unit and the other first wire that connects the other emission unit with the one package side electrode corresponding to the other emission unit are non-parallel with each other in plan view,
      the one first wire defining a first straight line that connects between a first emission-side connection point of the emission unit at which one first wire selected from the plurality of first wires is connected and a first package-side connection point of one package side electrode at which the selected one first wire is connected, and
      the other first wire defining a second straight line that connects between a second emission-side connection point of the emission unit at which an adjacent first wire adjacent to the selected one first wire is connected and a second package-side connection point of one package side electrode at which the adjacent first wire is connected,
      such that all angles formed between the first straight lines and the second straight lines in the semiconductor laser light source module are the same.

2. The semiconductor laser light source module according to claim 1, wherein respective lengths of the plurality of first wires are mutually the same.

3. The semiconductor laser light source module according to claim 1, further comprising:
   a circuit substrate including a plurality of substrate side electrodes, supplying power and signals to the semiconductor laser light source module; and
   a plurality of second wires that electrically and individually connect respective package side electrodes with respective substrate side electrodes,
   wherein
      one second wire that connects one package side electrode in the plurality of package side electrodes with the substrate side electrode corresponding to the one package side electrode, and the other second wire that connects the other package side electrode adjacent to the one package side electrode with the substrate side electrode corresponding to the other package side electrode, are non-parallel with each other in plan view.

4. The semiconductor laser light source module according to claim 2, further comprising:
   a circuit substrate including a plurality of substrate side electrodes, supplying power and signals to the semiconductor laser light source module; and
   a plurality of second wires that electrically and individually connect respective package side electrodes with respective substrate side electrodes,
   wherein
      one second wire that connects one package side electrode in the plurality of package side electrodes with the substrate side electrode corresponding to the one package side electrode, and the other second wire that connects the other package side electrode adjacent to the one package side electrode with the substrate side electrode corresponding to the other package side electrode, are non-parallel with each other in plan view.

5. The semiconductor laser light source module according to claim 3, wherein
   the substrate side electrode corresponding to the one package side electrode is disposed in an opposite side of a portion where the laser light is emitted with respect to the one package side electrode, and the substrate side electrode corresponding to the other package side electrode is disposed in a direction side orthogonal to a direction along which the laser light is emitted with respect to the other package side electrode, whereby the one second wire and the other second wire are non-parallel with each other in plan view.

6. The semiconductor laser light source module according to claim 3, wherein
respective lengths of the plurality of second wires are mutually the same.

7. The semiconductor laser light source module according to claim 5, wherein
respective lengths of the plurality of second wires are mutually the same.

8. A semiconductor laser apparatus comprising:
a semiconductor laser light source module including:
an emission unit provided with an upper electrode and a lower electrode, emitting a laser light in one direction;
an end face emitting laser diode having a plurality of emission units arranged in a state where emission directions of the laser light are aligned; and
a plurality of package side electrodes that supply current to respective emission units;
a circuit substrate including a plurality of substrate side electrodes, supplying power and a signal to the semiconductor laser light source module; and
a plurality of second wires that electrically connect respective package side electrodes with respective substrate side electrodes individually,
wherein
the substrate side electrode corresponding to one package side electrode in the plurality of package side electrodes is disposed in an opposite side of a portion where the laser light is emitted with respect to the one package side electrode, and the substrate side electrode corresponding to the other package side electrode adjacent to the one package side electrode is disposed in a direction side orthogonal to a direction along which the laser light is emitted with respect to the other package side electrode,
whereby one second wire that connects the one package side electrode with the substrate side electrode corresponding to the one package side electrode and the other second wire that connects the other package side electrode with the substrate side electrode corresponding to the other package side electrode are non-parallel with each other in plan view,
the one second wire defining a first straight line that connects between a first package-side connection point of the package side electrode at which one second wire selected from the plurality of second wires is connected and a first substrate-side connection point of one substrate-side electrode at which the selected one second wire is connected, and
the other second wire defining a second straight line that connects between a second package-side connection point of the package-side electrode at which an adjacent second wire adjacent to the selected one second wire is connected and a second substrate-side connection point of one substrate-side electrode at which the adjacent second wire is connected,
such that all angles ($\theta 4$-$\theta 6$) formed between the first straight lines and the second straight lines in the semiconductor laser light source module are the same.

* * * * *